METALLIZATION PROCESS

Filed Oct. 27, 1966

INVENTORS
PAUL P. CASTRUCCI
DAVID DeWITT
VIR A. DHAKA
WALTER E. MUTTER

BY George O. Saile
ATTORNEY

United States Patent Office 3,558,352
Patented Jan. 26, 1971

3,558,352
METALLIZATION PROCESS
Paul P. Castrucci, David De Witt, Vir A. Dhaka, and Walter E. Mutter, Poughkeepsie, N.Y., assignors to International Business Machines Corporation, Armonk, N.Y., a corporation of New York
Filed Oct. 27, 1966, Ser. No. 589,931
Int. Cl. H01l 1/14, 5/02
U.S. Cl. 117—212 8 Claims

ABSTRACT OF THE DISCLOSURE

A semiconductor device and a method for forming a semiconductor device wherein the ohmic contact is in the order of microns in width. A first metal is formed in the opening in the protective coating which acts as the ohmic contact to the semiconductor device. A second metal may be applied only over the first metal by electroless or electroplating techniques to increase the conductivity of the ohmic contact. Finally, an external land metal layer is deposited over a relatively large area of the protective coating in the area of the ohmic contact with finger-like extensions of the land metal layer contacting the ohmic contact by short overlaid areas. The external land is the only metal layer in the process formed which requires a photographic mask. The process, therefore, is not limited by present day photoengraving techniques.

This invention relates to a method for forming a metal contact for a semiconductor device and the resulting metal contact, and more particularly to a method for forming a metal contact for semiconductor devices wherein the regions being contacted are very narrow.

The design of modern high speed semiconductor devices has established a need for reducing the junction size. A typical semiconductor device structure requires the emitter region to be a very narrow and elongated structure. Further, it is essential that the base contacts which run parallel to the emitter contacts on both elongated sides should be positioned as close to the emitter contacts as possible. Fabrication of these devices is becoming increasingly more difficult because of the limitations of present photoengraving technology. The present procedure for forming metal contacts on emitter and base regions consists of a blanket deposition of metal on a semiconductor wafer in which the semiconductor devices have been diffused, and subsequently selectively etching the deposited metal using photoengraving masking techniques. This procedure has been satisfactory in the past when the contacts were larger. However, the narrowness of the emitter diffusion region and the closeness of the base contact to the emitter contact makes it necessary that the photomask have exceedingly thin lines separated by a very narrow region. Under these circumstances, the mask quality is quite poor. Further, during the metal etching process, the difference between over-etching and separating the base and emitter contacts is very small and very difficult to control.

It is therefore an object of this invention to provide a method for forming metal contacts for a semiconductor device wherein the metal contacts are in the order of microns in width.

It is another object of this invention to provide a method for forming metal contacts for a semiconductor device which is not limited by present photoengraving techniques.

It is a further object of this invention to provide a new metal contact structure for a semiconductor device which is made according to the method of the present invention.

These and other objects are accomplished in accordance with the broad aspects of the present invention by forming openings in the protective coating of the semiconductor device at the appropriate locations to expose the semiconductor regions thereunder. The opening is typically in the order of microns in width and quite elongated in length. Further, there are normally several of these openings within a fraction of a mil apart. A metal layer is deposited over both the openings to the semiconductor surface and the protective coating. The metal must be one which adheres well to the semiconductor and not very well to the protective coating. Further, the metal must be capable of forming an ohmic contact to the semiconductor. The metal is then removed from the protective coating by a suitable technique which does not affect the ohmic contacts.

A second layer of metal is then deposited over the ohmic contacts to increase the conductivity of the composite of the ohmic contact and the seocnd metal layer. The second metal may be deposited by methods which allow the deposition of the metal on the previously deposited metal layer and not upon the protective coating. Finally, an external land metal layer is deposited over a relatively large area of the protective coating with finger-like extensions of the land metal layer contacting the composite of the ohmic contact and second metal layer by short overlaid areas. The external land is the only metal layer in the process formed which requires a photographic mask. The resolution required for the photographic mask of the last deposition step is reduced by a factor of two, since the external land contact is formed only at the end of the composite of the ohmic contact and the second metal layer. Therefore, the process is not limited by present-day photoengraving techniques.

The foregoing and other objects, features and advantages of the present invention will be apparent from the following more particular description of the preferred embodiments of the invention as illustrated in the accompanying drawings.

Figure 1:
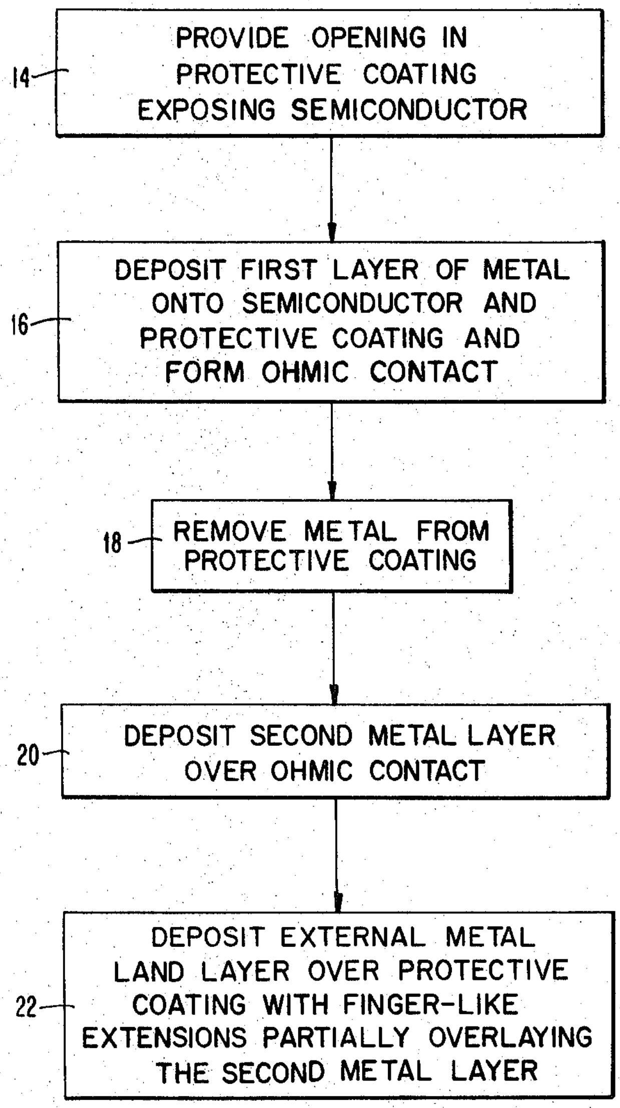
FIG. 1 is a flow diagram illustrating a preferred process of the present invention.
Figure 2:
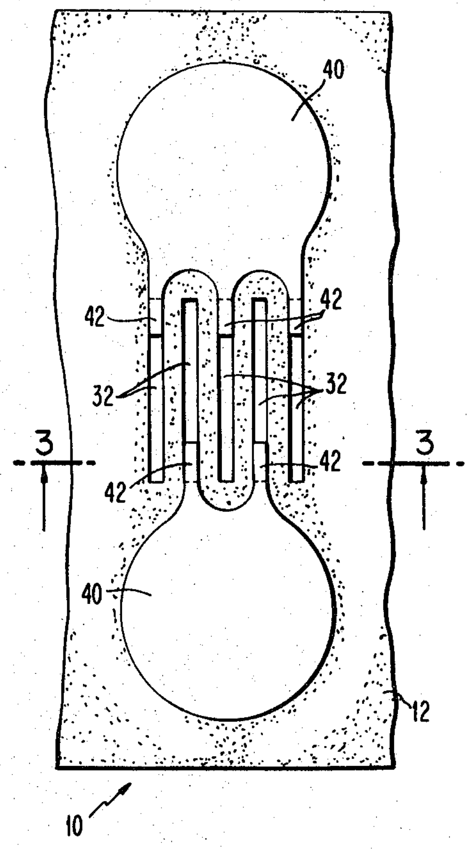
FIG. 2 is a top view of the metal contact for a semiconductor device of the present invention.
Figure 3:
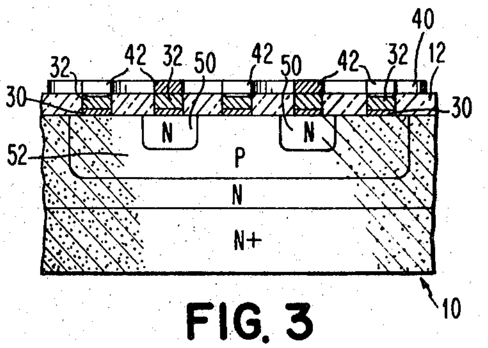
FIG. 3 is a cross-section taken along line 3—3 of FIG. 2.

Referring now more particularly to FIGS. 1, 2 and 3 there is shown a semiconductor body 10 which is coated with a protective layer 12. This protective layer may be formed by conventional thermal oxidation of the semiconductor, pyrolytic deposition of a silicone material to deposit silicon dioxide, anodization or other conventional procedures. The protective layer serves as a diffusion barrier and as an electrical insulator betwen the semiconductor body and the interconnection metal subsequently deposited on the protective layer 12. The layer 12 may be composed of protective coatings such as silicon dioxide, silicon nitride or similar materials.

Openings in the protective layer 12 are provided to obtain electrical contact to the semiconductor regions in the semiconductor material 10. The openings for the purpose of this invention are of a width in the order of microns. As described above, it is the metal contact which must be formed in and around these narrow width openings to electrically contact the semiconductor regions that exceed the capabilities of the present photoengraving techniques.

The openings themselves may be made in the protective coating 12 by use of standard photomasking procedures followed by chemical etching or sputter etching of the coating 12 through the mask to give the first step 14 in the flow diagram. According to the next step 16 of the method of the present invention, a metal layer is deposited by D.C. sputtering, electron beam evaporation or other suitable procedure over the openings to the semiconductor and the protective coating. The metal must have the property of adhering well to the semiconductor and being able to form a satisfactory ohmic contact to the semiconductor upon sufficient heating. Examples of this type metal are platinum, palladium and molybdenum. An ohmic contact of platinum silicide can then be made by heating a silicon area coated with a few hundred angstroms of platinum at a temperature between about 500° C. and 700° C. for a few minutes in a high vacuum. Ohmic contacts for the other suitable metals and semiconductor combinations will vary from the case of platinum and silicon according to their mutual alloying characteristics.

The next step 18 in the process is to remove the metal from the protective coating, leaving only the ohmic contact layer 30 covering the semiconductor within the narraw openings in the protective coating 12. This may be accomplished either by the use of an etchant, such as for example aqua regia in the case of platinum or palladium, or by mechanical buffing. The chemical etch procedure is preferred because the mechanical buffing tends to leave residues of the metal over the ohmic contact areas and cause stress formation in the ohmic contact layers.

The next step 20 is to deposit a second metal layer 32 over the ohmic contacts 30. This may be accomplished for example by electropolating, or chemical or electroless deposition. The chemical or electroless deposition is preferred because electrical contacts do not have to be made to the narrow ohmic contact regions as a prerequisite to the deposition. The second metal layer 32 will only deposit on the ohmic contacts 30 because the protective coating 12 is non-metallic, and is not sensitized for the case of an electroless deposition.

The second metal layer 32 is required to increase the conductivity or lower the resistance of the ohmic contact to the semiconductor because of the very narrow ohmic contacts and the subsequently applied stubby finger-like extensions of the external metal contact. Although it would be expected that increased thickness of the first metal layer 30 would result in a decrease of resistance, it has been found that this is incompatible with other fabrication and desirable device characteristics. This increased thickness of the first metal layer 30 would provide a layer of metal over the ohmic contacts and this layer of metal would be susceptible to the chemical etch step, which is necessary to remove the first metal layer from the protective coating 12. Further, increased thickness of the first metal layer 30 would increase the danger of shorted devices due to excessive alloying with the semiconductor. This is particularly significant where shallow diffusions are employed. The use of photoresist or metal resist techniques to protect the first metal from the chemical etch would also destroy the resist and be completely ineffective because of the necessary strength of the etchant. While mechanical buffing could be used as suggested above for the removal of the first metal from the protective coating 12, it has the disadvantages of forcing residual metal over the ohmic contacts and causing some stressing of the ohmic contacts that makes the ohmic contacts susceptible to chemical etches.

The third metal layer of metal is then deposited, as given in step 22, either by a blanket deposition of the metal followed by a suitable masking and subtractive etch process or through a suitable mask to form the external land pattern 40 having short finger-like areas 42 overlaying a small portion of the composite second metal layer 32 and ohmic contact 30. The mask in the second alternate may be either coated on the surface of the wafer, in the form of a photoresist or metal coating, or may be separate but held closely adjacent thereto. The third metal to be deposited may be aluminum or any other suitable metal, such as molybdenum or a sandwich of copper and molybdenum, chromium and copper, molybdenum and copper, or molybdenum and gold. The etchant used in the first alternate, of course, is dependent upon the particular metal to be etched.

The following example of the present invention is included in order to aid in the understanding of the invention and variations may be made by one skilled in the art without departing from the spirit and scope of the invention.

EXAMPLE

A transistor was prepared having an elongated emitter region 50 within a base region 52 such as shown in FIGS. 2 and 3. Contact openings of 0.1 mil in width by 1.7 mils in length and with 0.1 mil spacing were etched through the silicon dioxide protective coating to contact the emitter and base regions in the configuration shown in FIG. 2. The device was placed in a bell jar which was then evacuated to a vacuum of about $5\times10^{-5}$ torr. Platinum was electron beam evaporated onto the device at a rate of 50 angstroms per minute to form a platinum layer of about 300 angstroms over both the openings and the protective coating. The ohmic contact of platinum silicide was formed by further heating the platinum layer in a vacuum of about 2 to $5\times10^{-6}$ torr for about 5 minutes at a temperature of about 500° C. The temperature was then reduced and the device was removed from the vacuum chamber. The platinum was then removed from the silicon dioxide coating by immersing it in aqua regia. Only the platinum silicide was now present in the contact openings.

Approximately 4000 angstrom units of palladium were electrolessly deposited onto the platinum silicide ohmic contacts by use of the following electroless deposition solutions.

Solution A:
- Palladium chloride—7.17 gms./l.
- Ammonium hydroxide (solution)—390 cc./l.
- Disodium salt of EDTA (ethylene diamine tetraacetic acid)—34 gms./l.

Solution B:
- Hydrazine sulfate—13 gms./l.

The solutions are mixed just before use in the ratio of 25 cc. solution A to 1 cc. solution B, and heated to 50° C. The device was placed in the electroless plating bath and the palladium film formed at a rate of approximately 1000 angstroms per minute. The time in the electroless plating bath was 4 minutes.

The device was then placed in a vacuum chamber and an aluminum coating of about 5000 angstrom units was vacuum evaporated thereon. The external land pattern 40 having short finger-like areas 42 was then formed by application of a photoresist mask and subtractively etching with a standard phosphoric-nitric-acetic acid etching solution.

The device had a resistance of about 0.2 ohm per square as compared to about 2 ohms per square for devices that did not use the palladium second layer coating.

While the invention has been particularly shown and described with reference to the preferred embodiments thereof, it will be understood by those skilled in the art that various changes in form and detail may be made therein without departing from the spirit and scope of the invention.

We claim:

1. Method for forming a metal contact for a semiconductor device comprising:

provide a semiconductor device having an elongated opening in the order of microns in width in its inorganic protective coating exposing the semiconductor thereunder;

deposit a first layer of a metal which adheres well and forms an ohmic contact to substantially the entire length of said exposed semiconductor over the surface of said semiconductor;

deposit a second layer of metal over only said ohmic contact to increase the conductivity of composite of said ohmic contact and said second layer; and deposit a third layer of conductive metal from a solution to form an external land pattern having a short finger-like area overlaying a small portion of said second metal layer, thereby establishing an electrically conductive path from said third layer to said entire previously exposed surface of semiconductor.

2. The method of claim 1 wherein said first layer is applied by vacuum deposition over both said semiconductor and said protective coating and further comprising removing the portions of said first layer from said protective coating.

3. The method of claim 2 wherein said semiconductor is silicon, said protective coating is silicon dioxide and said first layer metal is platinum in the order of angstroms in thickness which forms a platinum silicide ohmic contact with the silicon.

4. Method for forming a metal contact for a semiconductor device comprising:

provide a silicon semiconductor device having an elongated opening in the order of microns in width in its silicon dioxide coating exposing the semiconductor thereunder;

vacuum deposit a layer of platinum metal in the order of angstroms in thickness onto said semiconductor over the surface of said semiconductor and said silicon dioxide coating;

heat the said device to form a platinum silicide ohmic contact to substantially the entire length of said exposed semiconductor;

remove said platinum from said silicon dioxide coating;

deposit by electroless deposition of a layer of metal over only said ohmic contact to increase the conductivity of the composite of said ohmic contact and said metal layer; and deposit a further conductive layer of metal through a suitable mask to form an external land pattern having a short finger-like area overlaying a portion of said composite layer.

5. The method of claim 4 wherein said platinum is removed from said silicon dioxide coating by action of aqua regia.

6. The method of claim 4 wherein said platinum is removed from said silicon dioxide coating by mechanical buffing.

7. The method of claim 4 wherein said electrolessly deposited metal is palladium and said further metal layer is aluminum.

8. The method of forming a plurality of elongated metal contacts in the order of microns in width and being spaced in the order of microns from each other, to a semiconductor surface of a semiconductor device comprising the steps of:

providing a semiconductor device having at least two elongated openings in the order of microns in width and being spaced in the order of microns from each other in its inorganic protective coating exposing the semiconductor thereunder;

depositing a first layer of a metal which adheres well and forms an ohmic contact along substantially the entire exposed surface of said semiconductor;

depositing a second layer of metal over only said ohmic contact to increase the conductivity of the composiite of said ohmic contact and said second layer; and depositing a third layer of conductive metal to form an external land pattern having a short finger-like area overlaying a small portion of said second metal layer;

thereby establishing an electrically conductive path from said third layer to said entire previously exposed surface of semiconductor.

References Cited

UNITED STATES PATENTS

| | | | |
|---|---|---|---|
| 3,399,331 | 8/1968 | Mutter et al. | 317—234X |
| 3,386,894 | 6/1968 | Steppat | 117—212X |
| 3,383,568 | 5/1968 | Cunningham | 29—590X |
| 3,365,628 | 1/1968 | Luxem et al. | 29—589X |
| 3,310,866 | 3/1967 | Anderson | 29—590 |
| 3,290,127 | 12/1966 | Kahng et al. | 317—234X |
| 3,274,670 | 9/1966 | Lepsetter | 317—234 |
| 3,274,022 | 9/1966 | Rhoda | 117—130E |
| 3,231,421 | 1/1966 | Schmidt | 117—213X |
| 3,362,851 | 1/1968 | Dunster | 117—217X |
| 3,165,430 | 1/1965 | Hogle | 317—235 |

ALFRED L. LEAVITT, Primary Examiner

A. GRIMALDI, Assistant Examiner

U.S. Cl. X.R.

29—590, 591; 117—107, 217; 317—234

PO-1050
(5/69)

UNITED STATES PATENT OFFICE
CERTIFICATE OF CORRECTION

Patent No. 3,558,352 Dated January 26, 1971

Inventor(s) P. P. Castrucci; D. DeWitt, V. A. Dhaka; W. E. Mu

It is certified that error appears in the above-identified patent and that said Letters Patent are hereby corrected as shown below:

In the claims:

| | | | |
|---|---|---|---|
| Claim 1 | Column 5 | Line 1 | after "metal" insert -- from a solution -- |
| Claim 1 | Column 5 | Lines 4,5 | delete "from a solution" |
| Claim 1 | Column 5 | Line 2 | before "composite" insert -- the -- |

Signed and sealed this 25th day of January 1972.

(SEAL)
Attest:

EDWARD M.FLETCHER, JR.
Attesting Officer

ROBERT GOTTSCHALK
Commissioner of Paten